US008244323B2

(12) United States Patent
Yamaguchi

(10) Patent No.: US 8,244,323 B2
(45) Date of Patent: Aug. 14, 2012

(54) SUPERCONDUCTING TAPE WIRE MATERIAL AND METHOD OF MANUFACTURING SAME

(75) Inventor: Sataro Yamaguchi, Aichi (JP)

(73) Assignee: Chubu University Educational Foundation, Aichi (JP)

( * ) Notice: Subject to any disclaimer, the term of this patent is extended or adjusted under 35 U.S.C. 154(b) by 0 days.

(21) Appl. No.: 12/994,721

(22) PCT Filed: May 27, 2009

(86) PCT No.: PCT/JP2009/059678
§ 371 (c)(1),
(2), (4) Date: Feb. 14, 2011

(87) PCT Pub. No.: WO2009/145220
PCT Pub. Date: Dec. 3, 2009

(65) Prior Publication Data
US 2011/0136674 A1    Jun. 9, 2011

(30) Foreign Application Priority Data

May 27, 2008 (JP) ................................. 2008-138294

(51) Int. Cl.
*H01L 39/24* (2006.01)
*H01L 39/14* (2006.01)

(52) U.S. Cl. ...................................... 505/231; 505/431

(58) Field of Classification Search .................. 505/220, 505/231, 236, 238, 431, 432, 490, 500, 823
See application file for complete search history.

(56) References Cited

U.S. PATENT DOCUMENTS

| 7,749,939 | B2 * | 7/2010 | Kumakura et al. | 505/430 |
| 2001/0009888 | A1 * | 7/2001 | Riley, Jr. | 505/432 |
| 2003/0205403 | A1 * | 11/2003 | Tanaka et al. | 174/125.1 |
| 2004/0121915 | A1 * | 6/2004 | Tanaka et al. | 505/100 |

FOREIGN PATENT DOCUMENTS

| JP | 53-55793 A | 5/1978 |
| JP | 59-224008 A | 12/1984 |
| JP | 04-118816 A | 4/1992 |
| JP | 05-151843 A | 6/1993 |
| JP | 07-283023 A | 10/1995 |
| JP | 09-167530 A | 6/1997 |

OTHER PUBLICATIONS

Svetlomir Stavrev, et al., "Self-Field and Geometry Effects in Transport Current Applications of Multifilamentary Bi-2223/Ag Conductors," IEEE Transactions on Applied Superconductivity, Sep. 3, 2003, pp. 3807-3813, vol. 13, No. 3.

A.M. Campbell, et al., "AC Losses in High $T_c$ Superconductors," IEEE Transactions on Applied Superconductivity, Jun. 1995, pp. 682-687, vol. 5, No. 2.

Y. Yang, et al., "The influence of geometry on self-field AC losses of Ag sheathed PbBi2223 tapes," Physica C. 1996. pp. 378-386, vol. 256.

* cited by examiner

*Primary Examiner* — Colleen Dunn
(74) *Attorney, Agent, or Firm* — Sughrue Mion, PLLC

(57) ABSTRACT

A method of manufacturing a superconducting tape wire, wherein a reduction in critical current in the superconducting tape wire and the effective AC loss are suppressed. To manufacture the superconducting tape wire, the filaments filled with superconducting material powder and having a flat elliptic or rectangular cross section are disposed in a pipe having a shape whose sides in a pressing direction have a smaller length than adjacent sides, and then the pipe is compressed in the short-side direction to form the pipe in a tape shape.

13 Claims, 10 Drawing Sheets

SUPERCONDUCTING TAPE WIRE MATERIAL AND METHOD OF MANUFACTURING SAME

CROSS REFERENCE TO RELATED APPLICATIONS

This application is a National Stage of International Application No. PCT/JP2009/059678, filed on May 27, 2009, which claims priority from Japanese Patent Application No. 2008-138294, filed on May 27, 2008, the contents of all of which are incorporated herein by reference in their entirety.

TECHNICAL FIELD

The present invention relates to a manufacture, a method of installation and a structure or the like of a superconducting tape wire material.

BACKGROUND

A method of manufacturing a bismuth-based superconducting tape wire material will now be described. FIG. 1 shows a manufacturing process of a bismuth high temperature superconducting wire ("Achievement of High Temperature Superconducting Wire Critical Current Exceeding 200 A", Sumitomo Electric Industries SEI Technical Review, No. 169 published in July 2006). Bismuth-based cuprate powder is charged in a silver pipe, and extended to manufacture a single wire, and a plurality of single wires are collected, and put into a silver pipe for outer sheath, and furthermore extended to be formed into a tape shape in the end. At present, since a silver pipe has a shape with about 100 mm outside diameter, and a tape wire material has about 4 mm width and about 0.2 mm depth (thickness), so it is pressed from all directions to be formed into a tape shape. During this period, necessary calcination is performed. The above-mentioned manufacturing method depends on the point that bismuth-based oxide superconducting material is an anisotropic material, and has superconductive characteristics only in a specified direction. Crystals grow from silver surface (This direction is referred to as "c-axis"), and a perpendicular direction to the c-axis becomes a superconductive direction, and hence a tape shape is used in order to get a large contact area with silver.

FIG. 2 is a cross sectional photograph of a tape wire sample, and FIG. 3 is a magnified view of another tape wire sample. As illustrated in FIGS. 2 and 3, a bismuth-based oxide superconducting material is black-colored, and this portion has a thin extended shape, and referred to as "filament". It is recognized that while there are many filaments in the center portion, there are less filaments and the cross sectional shape is not a thin tape shape but thick in the end portion. Therefore, in the step that a plurality of thin single wires are put into a silver pipe, many single wires are present at the central portion. Therefore, even if it is rolled to be formed into a tape shape, many superconducting filaments are present in the central portion. The filaments also have thin tape shape. The reason is that crystals grow from the silver surface. By adopting the shape like this (filament shape), it is possible to produce many superconducting filaments, and superconducting characteristics are improved. There are also samples of the same kind of wire material having a circular cross section.

FIG. 4 shows a cross sectional photograph in which the central portion of another sample is further magnified. FIGS. 2 to 4 are photographs in Sumitomo Electric Industries SEI Technical Review ("Achievement of High Temperature Superconducting Wire Critical Current Exceeding 200 A", NUMBER 169, published in July 2006) similarly to FIG. 1, and an inventor's photograph(s).

In FIG. 4, portions, in which a plurality of filaments are overlapped and silver between the filaments disappears, are seen somewhere. This tendency is widely observed in the present bismuth-based wire. Assuming that the direction in which superconductivity appears is growing from the silver surface, this cross sectional shape is not preferable. If the cross sections of filaments are circular or the cross section area get large at the end portion, the loss, referred to as alternating current loss, gets large, in case of assuming alternating current application.

As shown in FIGS. 2, 3, the region in which filaments are distributed forms an elliptic shape as a whole.

FIG. 5 shows a schematic view of the cross section. The reason is that the cross sectional shape is circular before being rolled to tape shape.

In a structure shown in FIGS. 3, 4, while filaments are often overlapped in the central portion of the tape wire, the filaments are not so frequently overlapped and the shape is also not a thin tape shape in the end portion. The reason is that as the width of the central portion is wide, many silver pipes for segmentation, which will become filaments ultimately, can be packed into a circular cross section of a silver pipe for outer sheath.

Since current is flowed in the superconducting filaments, if the current is flowed at the maximal ability of the tape wire, when taking the current distribution along the longitudinal (x-) direction of the cross section of tape wire material, it results in a distribution having a peak in the central portion. The reason is that many superconducting filaments are present in the central portion of the tape wire material.

FIG. 6 (A) shows one ideal arrangement of filaments. This is the case where filaments are uniformly arranged in the direction of x-axis (abscissa). In this case, a current distribution can be expected to be uniform along the abscissa. If alternating current is flowed in this sample, the current density distribution is as shown in FIG. 6 (B) in many instances. The current density distribution of FIG. 6 (B) is a well-known electromagnetic phenomenon, which generally occurs in a material having a low electric resistivity. This is a phenomenon caused by the fact that an electric field, applied in order to flow current through a tape wire, does not penetrate into the interior part of the conductor immediately, but penetrates from the outer part, and it is called "skin effect". Since the tape wire material has not only superconducting filaments in the interior part but silver (the electric resistivity is lower than copper), it is a little complicated. And since as for the current density, the current flows so that the inductance is minimal from the principle of least action, the current density is raised at the end portion irrespective of the presence of filaments. As to this kind of analysis, refer to references such as non-patent documents 1, 2 etc.

[Non-Patent Document 1] Svetlomir Stavrev, Bertrand Dutoit, Francesco Grilli, "Self-Field and Geometry Effects in Transport Current Applications of Multifilamentary Bi-2223/Ag Conductor", IEEE Trans. Appl. Supercond., vol. 13, No. 3, pp. 3807-3813, 2003.

[Non-Patent Document 2] A. C. Campbell, "AC Losses in High Tc Superconductors", IEEE Trans. Appl. Supercond., vol. 5, No. 2, pp. 682-687, 1995.

[Non-Patent Document 3] Y. Yang, T. Hughes, C. Beduz, D. M. Spiller, R. G. Scurlock, W. T. Norris, "The influence of geometry on self-field AC losses of Ag sheathed PbBi2223 tapes", Physica C, vol. 256, pp. 378-386, 1996.

SUMMARY

The following analyses are given according to the present invention.

As shown in FIGS. 2, 3 and 5, filaments are concentrated in the central portion. They are tape wires suitable for flowing current in the central portion, and since current flows in all filaments in a direct current application, etc., there is no particular problem. However, in alternating current application, or even in a direct current use where the current changes with time, current is concentrated in the end portion of the tape wire. In many cases, time constant is generally more than or equal to 1 second. That is, in an alternating current of at least 1 Hz in frequency, current is concentrated in the end portion of tape wire.

In commercial frequency, the current density at the end portion of tape wire is high. However, in the end portion of superconducting material, there are cases where the number of filaments is small, and furthermore quality of material of the superconducting filament is worse than that in central portion of superconducting tape material. In fact, as shown in FIG. 3, the superconducting filaments are made into a ball-like shape in the end portion, and do not become a thin tape shape as in the central portion. For this reason, the superconducting current density can not be made high. Therefore, current is flowed through silver sheath of the end portion of the superconducting tape wire, or current is flowed through the poor quality filaments (portion in which superconducting current is low) of the end portion exceeding the superconducting current. As a result, an effective alternating current loss is increased.

In the direct current application, the time constant of the superconducting filament also ranges from several hours to several days in some situations. In this situation, if current varies during the period, the similar phenomenon occurs as the case of alternating current (mainly assuming commercial frequency) is flowed. In this situation, it seems that the critical current density is apparently reduced. This is an extremely serious problem to the application of a superconducting cable, and solution for this is desired.

Furthermore, when a superconducting cable is manufactured by using an oxide superconductor (a kind of ceramics), if tensile stress remains in the ceramics, it is known from researches so far that it is broken physically, or the superconducting characteristics are extremely deteriorated.

Therefore, the characteristics of the superconducting cable can be taken advantage of by not leaving the tensile stress in the cable as possible. As a measure for suppressing heat invasion from the exterior, the space between the inner pipe and the outer pipe of low-temperature heat insulating double shell pipes, which keeps the superconducting cable low temperature, is set to be vacuum. However, since heat invasion by radiation can not be reduced in vacuum, in many cases, surface-treatment is performed and material having a high reflectance is coated on the surface of inner pipe so that radiation from the outer pipe is reflected, or multi-layer radiation reflection coating is wound on the inner pipe, and this is called MLI. The most effective method is narrowing the surface area. Hence, a straight pipe is used at the experiment of the present application in Chubu University.

However, since the temperature of the inner pipe is changed from normal temperature to low temperature, the inner pipe is subjected to thermal contraction. In order to absorb the thermal contraction, a bellows pipe or a corrugate pipe is partially used as the inner pipe. And then, since this surface [area] is larger than that of the straight pipe, there is a problem in which heat leak becomes larger.

Furthermore, since refrigerant is circulating in the inner pipe, the pressure loss occurs accompanied by this circulation. Since this pressure loss causes heat invasion (leak) to the low-temperature system, this must be reduced.

Therefore, the present invention has been made under such circumstances mentioned above, and it is an object of the present invention to provide an apparatus suppressing increase of effective alternating current loss, and suppressing decrease of critical current, and a manufacturing method.

In addition to the above-mentioned object, it is an object of the present invention to provide a supporting structure in which stress such as tensile stress, etc. does not occur in the superconducting cable, an apparatus aimed for suppressing heat invasion into low-temperature inner pipe, suppressing pressure loss accompanied by refrigerant circulation, and a manufacturing method.

The present invention is roughly constituted below in order to solve the above-mentioned problem(s).

In a first aspect of the present invention, a method of manufacturing a superconducting tape wire is provided, wherein upon manufacturing a superconducting tape wire, superconducting material powder is charged into a first pipe having a flat elliptic or rectangular cross section; a plurality of the first pipes are placed in a second pipe having a rectangular cross section, and the second pipe is compressed in a short-side direction or in both short-side and long-side directions to be finished in a tape shape.

A manufacturing method of the present invention, to manufacture a superconducting tape wire, may include the following steps: superconducting material powder is charged in a first pipe having a flat elliptic or rectangular cross section; a plurality of the first pipes are placed in a second pipe having a cross sectional shape in which a distance (along a pressing direction) between opposing sides at an end portion(s) is larger than that at a central portion; and the second pipe is compressed to be finished in a tape shape.

In a manufacturing method of the present invention, before the superconducting material powder is charged, the first pipe having a flat elliptic or rectangular cross section may be prepared in advance.

In a manufacturing method of the present invention, a first pipe having a substantially circular cross section may be prepared, and after superconducting material powder is charged in the first pipe, the first pipe may be compressed to form the first pipe having a flat elliptic or rectangular cross section.

In a manufacturing method of the present invention, the second pipe is rolled by using a rolling apparatus for a circular cross section or a square cross section and providing guides on the top and the bottom of the second pipe.

In accordance with the present invention, a superconducting tape wire is provided that superconducting material powder is charged in a first pipe having a flat elliptic or rectangular cross section, and a plurality of the first pipe are placed in a second pipe having a rectangular cross section, and the second pipe is compressed in a short-side direction or in both short-side and long-side directions to be finished in a tape shape.

The present invention may have a structure in which superconducting material powder is charged in a first pipe having a flat elliptic or rectangular cross section, and a plurality of the first pipe are placed in a second pipe having a cross sectional shape in which a distance (along a pressing direction) between opposing sides at an end portion(s) is larger than that at a central portion; and the pipe is compressed to be finished in a tape shape.

In the present invention, to fix a superconducting cable manufactured by winding the superconducting tape wire around a winding core, a thermal contraction/expansion of a superconducting cable is absorbed by an elastic member(s).

In the present invention, a pipe connected to the superconducting cable is connected to a pipe-shaped flange in which a thread(s) is cut on the inside, and a (outer) flange having a groove(s) on the outside functioning as a stopper is fitted [to the cable flange], and fixed so that [the thread(s) and] the superconducting cable do not rotate.

In the present invention, an apparatus for securing the superconducting cable is provided that thermal contraction/expansion of the superconducting cable is absorbed by an elastic member(s) so that the thermal stress in the longitudinal direction of the superconducting cable reduced and is not large.

In the present invention, a pipe-shaped flanged member connected to a pipe connected to the superconducting cable is provided in which a thread(s) is cut on the inside of the pipe-shaped flanged member and a flange functioning as a stopper (and supporter) is fitted into the pipe-shaped flanged member.

In the present invention, a connecting device of a superconducting cable is provided that comprises heat insulating double shell pipes in which the superconducting cable is housed in the inner pipe, and the inner pipes are connected via a bellows pipe section, and comprises a radiation shield (MLI) covered the bellows pipe.

The present invention may have a structure in which a flow guide plate(s) is provided along a direction of refrigerant flow within the bellows pipe.

The present invention comprises a measuring wire(s) monitoring whether or not the superconducting tape wire material is in a superconductive state, and measuring the temperature and the stress at the same time in the inside of the core [of the cable].

According to the present invention, increase of effective alternating current loss can be suppressed, and decrease of critical current can be suppressed.

EXPLANATIONS OF SYMBOLS

Refer to the end of the Specification.
Preferred Modes

Figure 7:
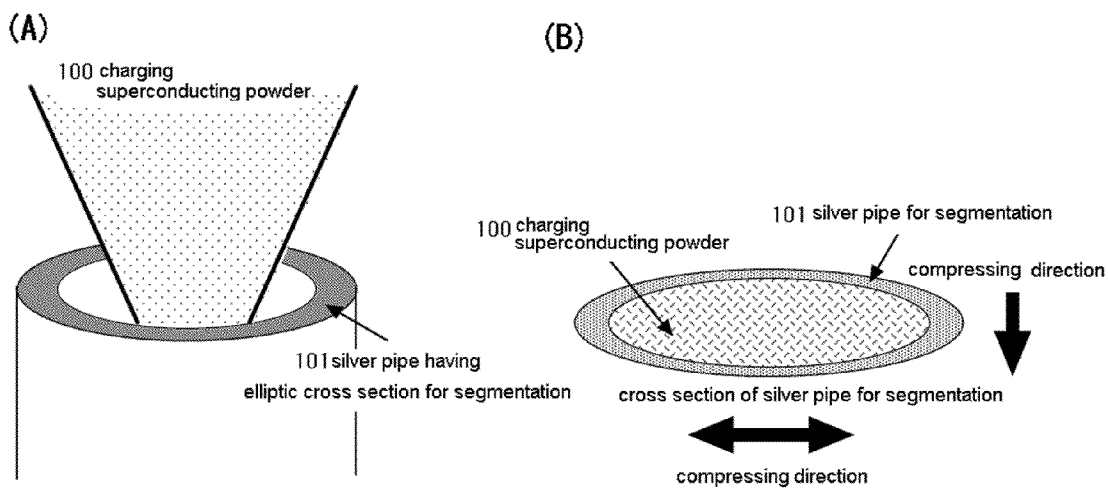
FIG. 7 shows a schematic view of a silver pipe for segmentation having an elliptic cross section for segmentation, a filling direction of superconducting powder material, and a smashing direction.
Figure 8:
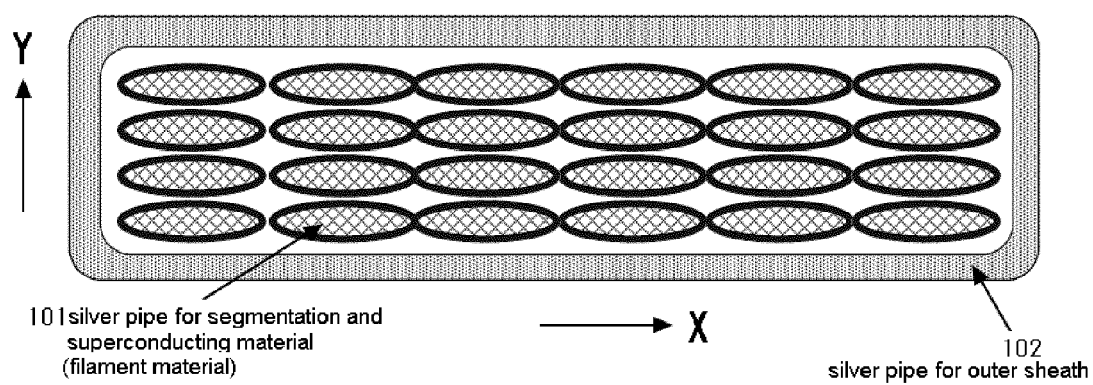
FIG. 8 shows a schematic view of a cross section of a silver pipe for outer sheath of one embodiment of the present invention.

An embodiment of the present invention will now be described below. FIGS. 7, 8 illustrate one embodiment of the present invention. FIG. 7 shows a shape of silver pipe for segmentation 101. Silver pipe for segmentation 101 is rolled to tape shape ultimately. Therefore, from the beginning, the cross section is not set to be circular but elliptic or flat rectangular, and superconducting powder is charged (Refer to FIG. 7 (A)). It is rolled to be thin in both short and long axis directions (Refer to FIG. 7 (B)).

Figure 4:
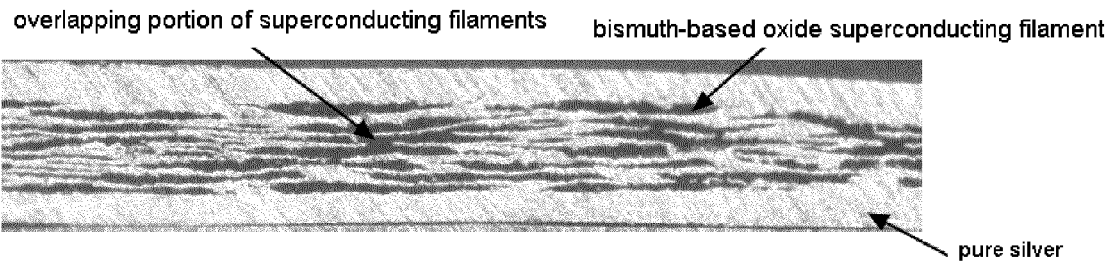
FIG. 4 shows a cross section of a bismuth high temperature superconducting tape wire (third).
Figure 5:
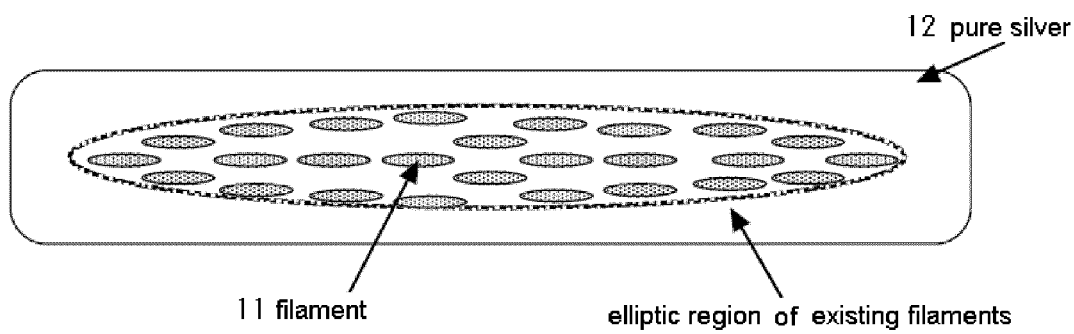
FIG. 5 shows a schematic view of a cross section of a bismuth high temperature superconducting tape wire.

In accordance with the present embodiment, it is less likely that the silver pipes for segmentation are partially torn to consolidate a plurality of superconducting filaments in the inside as shown in FIG. 4.

Another method is that superconducting powder is charged into a pipe having a circular cross section, and after that, the pipe is rolled into an elliptic cross section or a laterally-long rectangular cross section. In this case, since more superconducting materials are included in the inside, the filling rate is increased substantially.

FIG. 8 shows a state in which strands, which are manufactured according to FIG. 7 and become superconducting filaments, are placed in a silver pipe for outer sheath 102 having a rectangular cross section.

Figure 1:
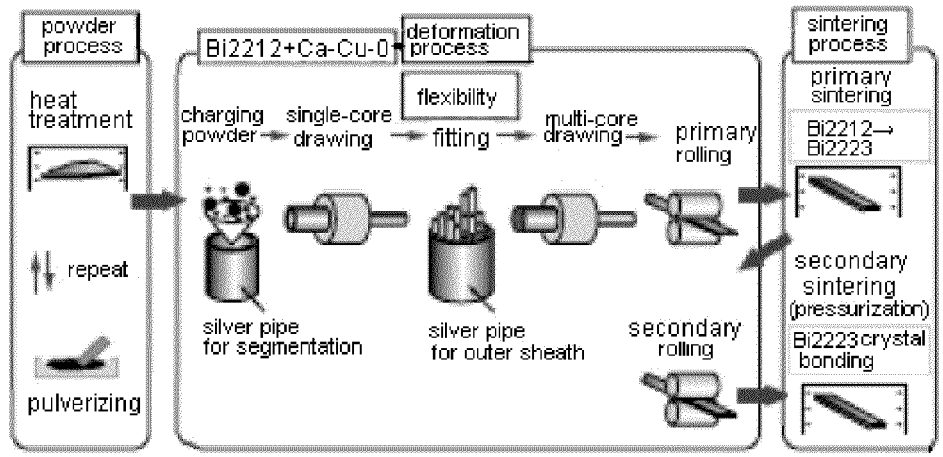
FIG. 1 shows an example of manufacturing process of a bismuth (BSCCO) high temperature superconducting wire.
Figure 2:
FIG. 2 shows a cross section of a bismuth high temperature superconducting tape wire (first).

The density of the filaments is set to be constant from the central portion to the end portion in the x direction. The structure in which silver pipes for segmentation filled with superconducting material are arranged like this has never been tried. In the method shown in FIG. 1, it is difficult to manufacture a superconducting tape wire having thin tape-shaped superconducting filaments up to the end portion. It is rolled by applying pressure in both X and Y directions.

That is, since if a cross section of the silver pipe for outer sheath 102 is rectangular, it is possible that the number of filaments (Superconducting material in the silver pipe for segmentation will be a superconducting filament ultimately) filled in the central portion of silver pipe for outer sheath 102 can be nearly equal to the number of filaments in the end portion of silver pipe for outer sheath 102 as shown in FIG. 8, occurrence of the case is suppressed where there are many filaments in the central portion, while less filaments in the end portion, and the cross sectional shape of the superconducting filaments is made into a ball-like rounded shape as the case with the circular shaped silver pipe for outer sheath.

Figure 3:
FIG. 3 shows a cross section of a bismuth high temperature superconducting tape wire (second).

Hence, when it is finished to be tape shaped by compressing, the silver pipes for segmentation 101 including superconducting material in the inside are not rolled to be flat to an extent more than needed. Hence, it is in principle possible to avoid an occurrence, in which silver pipe for segmentation is torn and the superconducting filaments contact directly [with each other] as shown in FIGS. 3, 4.

Figure 6:
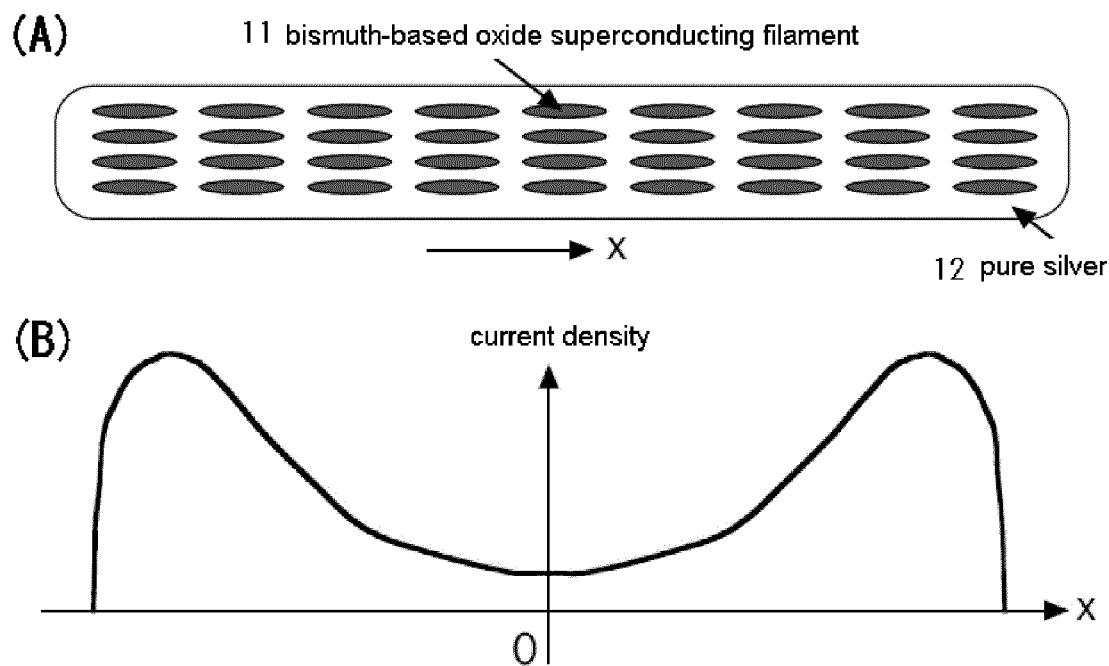
FIG. 6 shows one example of uniform arrangement of filaments in the width direction of tape wire and a current density distribution when alternating current is used.
Figure 9:
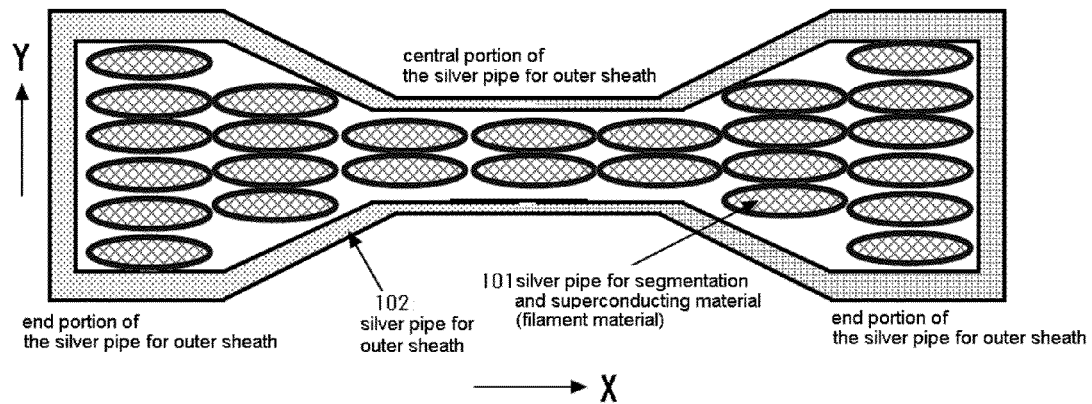
FIG. 9 shows a schematic view of a cross section of a silver pipe for outer sheath of one embodiment of the present invention.
Figure 10:
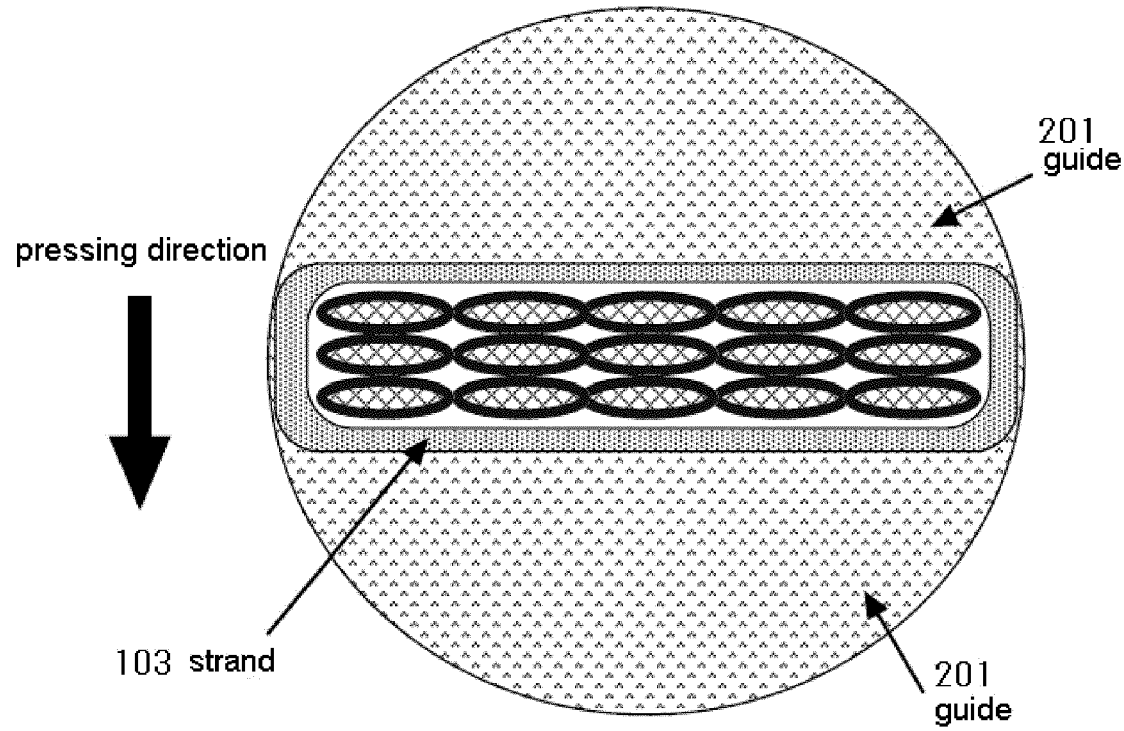
FIG. 10 shows a schematic view of a rolling guide of one embodiment of the present invention.

Furthermore, FIG. 9 shows another structure example of a silver pipe for outer sheath. As shown in FIG. 6, generally, when an alternating current is flowed in a tape wire, the current density is concentrated at the end portion(s) of the tape wire. Therefore, it is preferable that many good quality superconducting filaments are located at the end portion(s). In accommodation to this, the number of superconducting filaments at the end portion(s) can be increased by widening the cross sectional shape of silver pipe for outer sheath 102 at the end portion(s), thereby increasing the number of silver pipes for segmentation which are capable of being packed there.

A strand, which is manufactured as mentioned above used for manufacturing a tape-shaped wire, has to be rolled. There are a number of rolling machines designed for a circular or square cross section. Guides 201 are attached on the upside and downside of the strand which will become a tape wire. A thin strand can be manufactured steadily. A thin tape wire can be obtained from part of the central portion of the strand at the same time.

Next, a method for securing a superconducting cable will be described. The superconducting cable is secured at the end thereof. It suffers shortening due to thermal contraction caused by temperature decrease from room temperature. For example, 30 meters per 10 kilometers are shortened at liquid nitrogen temperature, and hence countermeasure against the thermal contraction is an important task.

As the cable is expanded or contracted in response to up and down of the temperature, a large tensile or compressive force should not be applied to the cable. For example, by 1 meter or more will be taken care of expansion and contraction by an external pipe structure. During cooling down period and warming-up period, a fine adjustment with high accuracy is needed so that tensile stress or compressive stress is reduced or not appeared in the superconducting cable.

Figure 11:
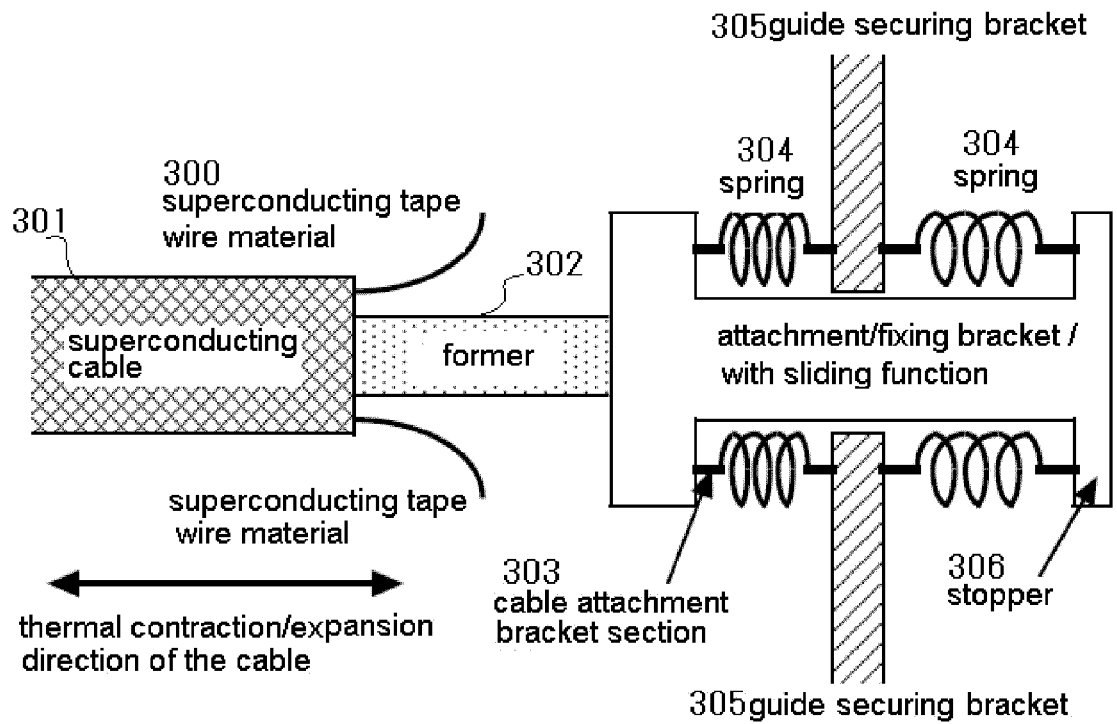
FIG. 11 illustrates a method for securing a superconducting cable of one embodiment of the present invention.

FIG. 11 shows a structure of one embodiment of the present invention. With reference to FIG. 11, superconducting cable 301 is manufactured by winding an insulating layer and superconducting tape wire material 300 around a winding core referred to as "former" (winding core) 302. This is attached to guide securing bracket 305 via spring(s) 304. Spring 304 absorbs the thermal contraction of superconducting cable 301, so that thermal stress is not applied (reduced) to the superconducting cable at or above a certain level.

Figure 12:
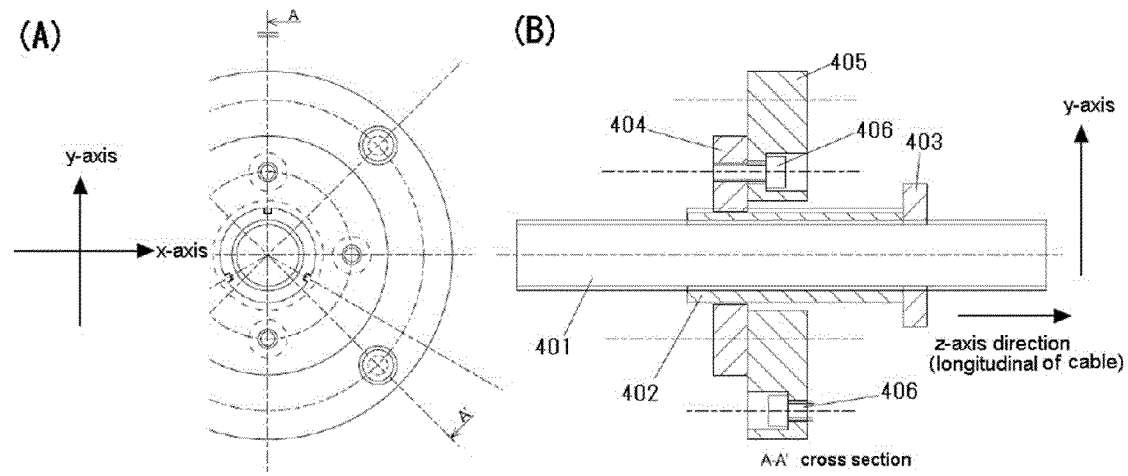
FIG. 12 shows a drawing for securing a superconducting cable of one embodiment of the present invention.
Figure 13:
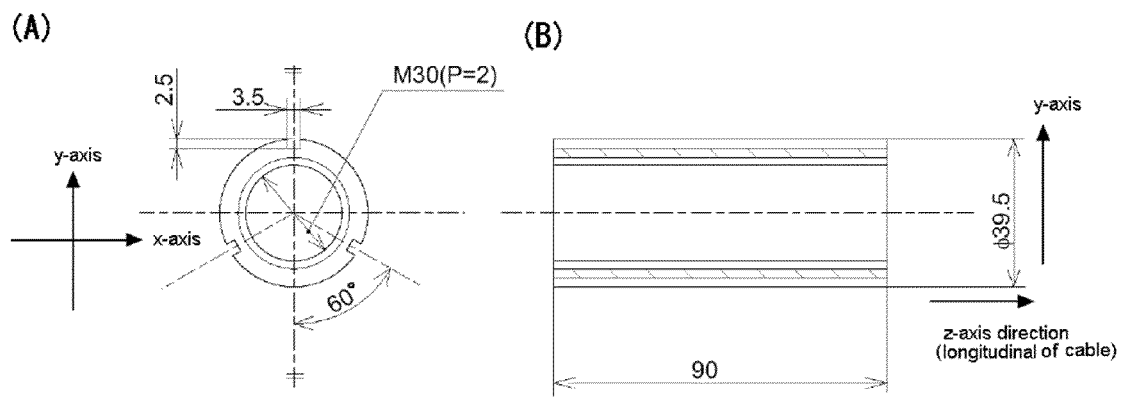
FIG. 13 shows a structure of a flanged member of one embodiment of the present invention.

Next, the attachment jig or attachment method of the cable will be described with reference to a partial drawing in which the cable is attached concretely. FIG. 12 (A) is a front view, and FIG. 12 (B) is a cross-sectional view thereof. FIG. 12 (A) is a transverse cross-sectional view of the cable, and this cross section is referred to as XY-plane, and the longitudinal direction of the cable is referred to as Z direction. FIG. 12 (B) shows a cross-sectional structure of a fixing section on YZ-plane. It will be illustrated with reference to FIG. 12 (B) below. 401 is made of a metal pipe which is firmly connected to the former of a superconducting cable to form a unified body, and the cross-section is circular, and the thread(s) or the trench is cut on its surface. Pipe-shaped flanged member 402 is connected to the metal pipe 401. A thread(s) or the trench is cut on the inside of pipe-shaped flanged member 402, and fitted to the thread of metal pipe 401. Grooves are engraved at three positions of the outside (Refer to FIG. 13). Flange 403 is a stopper. It is secured so that the thread [pipe 401] does not rotate, and at the same time, even though it moves largely in the longitudinal direction (Z-direction) of the cable, it is secured not to be separated from a flange 404. The flange 404 has notches at three places, which are fitted (engaged) into grooves at three positions on the surface of flanged member with thread(s) on the inside 402 as shown in FIG. 13. According to this structure, the cable does not rotate in the XY-plane, and is movable freely in the Z-direction in which the length is varied by thermal contraction.

The flange 404 is connected to a flange 405 by using screwbolt(s) 406, and the flange 405 is ultimately connected to the vessel of the container, which is thermally insulated by vacuum.

The flanged member 402 is made of different material from the flange 404. For example, they are a combination of stainless steel and copper alloy, etc. The same materials are not used, which prevents them from joining when their temperatures are raised by friction. By adopting this structure, when a thermal contraction or the like occurs in the superconducting cable during cooling down period, keeping low temperature period and warming-up period, the cable can be expanded or contracted freely in the direction of Z-axis. Hence, it is a supporting method which does not cause a large thermal stress in the superconducting cable. As shown in FIG. 11, springs may be inserted into this place. Because of a structure having three grooves, a rotation in the XY-plane does not occur. Mechanical characteristics of the superconducting cable are mainly determined by the former. If residual stress remains in the former, there is possibility that the cable is twisted by temperature change. However, characteristic degradation, fracture and deformation of the strand of the superconducting cable can be prevented thereby.

Figure 14:
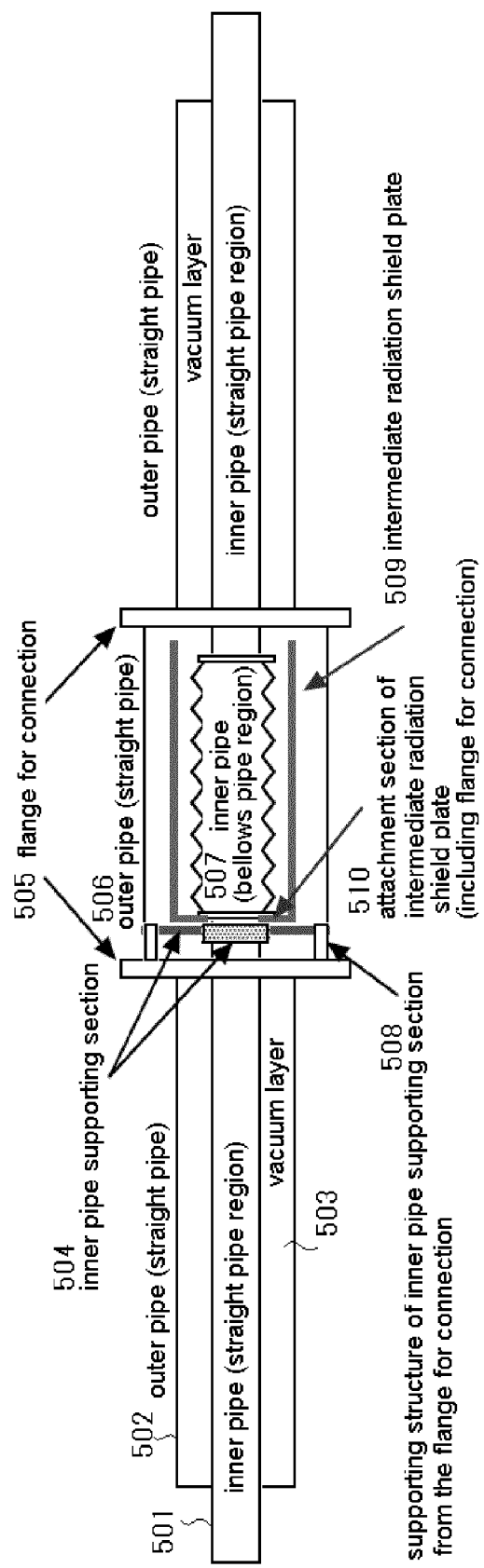
FIG. 14 shows one example of structure of radiation shield in an inner pipe connecting section of one embodiment of the present invention.

Next, with reference to FIG. 14, a structure of radiation shield in the heat insulating double shell pipes will be described. Inner pipe 501 of the heat insulating double shell pipes is mainly constituted by using a straight pipe. Since the surface area per unit length of the straight pipe section is small [as compared with the bellows and corrugated pipes], amount of heat leak by radiation from outer pipe at room temperature will be small. As a result of the experiment it has been turned out that if the reflectance of the surface is raised, equivalent amount of heat invading can be obtained even without multi-layer radiation shield film (MLI). Since the cable has to be bent, bellows pipe(s) 507 (including a corrugated pipe, too) is connected to a straight pipe(s) partially. Since the bellows pipe section has a large surface area, the heat leak from this portion is increased. Therefore, a structure, in which a radiation shield panel(s) is installed only in this portion, is needed. FIG. 14 shows a structure of radiation shield of bellows pipe section. Outer pipe 502 is constituted as a straight pipe mainly. Outer pipe 502 has a higher strength than the bellows pipe or corrugated pipe. Inner pipe 501 is installed inside of outer pipe 502, and the space between them is kept in high vacuum 503, and inner pipe 501 is insulated adiabatically. A superconducting cable is installed inside of inner pipe 501, and refrigerant not shown in the figure flows. Inner pipe(s) is connected to bellows pipe(s) at certain specified distance (interval). Connecting operation is made easy by aligning a connecting section of outer pipe to a connecting section of inner pipe. At the connecting section, the inner pipe 501 supports the weight of the inner pipe, the superconducting cable in the inside and the refrigerant via inner pipe supporting section 504. Since outer pipe 502 is at room temperature and the thermal contraction is not large, it is less necessary in the outer pipe that bellows pipes or corrugated pipe are used also in the connecting section(s). Due to this, they are not used in FIG. 14. On the other hand, since temperature of inner pipe 501 is dropped from room temperature to liquid nitrogen temperature, inner pipe 501 has a large thermal contraction.

For example, about 30 meters thermal contraction is estimated for 10 kilometers. Therefore, bellows pipe (including corrugate pipe) which is capable of having about 0.2 meter expansion and contraction per 10 meters is connected to inner pipe 501. That is, the reason is that as 3 centimeters thermal contraction per 10 meters is caused, this level of amount can be absorbed by using 20 centimeters bellows pipe. The bellows pipe has a larger surface area than the straight pipe. Heat leak by radiation heat to this portion becomes large. In the present embodiment, for example, the reflectance is increased by applying plating on the surface of bellows pipe 507.

Two further strategies can be applied. One is that multi-layer insulation film (it is called "MLI" multi-layer-insulator) is wound only in the portion of bellows pipe 507.

Another is that as shown in FIG. 14, a support (inner pipe supporting section 504) is provided from a flange for connection 505 connecting between a straight pipe section 501 and a bellows pipe section 507 which constitute the inner pipe, and an intermediate radiation shield panel 509 metal-coated on both surfaces having a thin insulation with high reflectance is concentrically inserted into the middle of the vacuum section. The support of the inner pipe is needed in order to support the weight of the inner pipe. The inner pipe supporting section is provided in the connecting section 505. A support is performed from the outer pipe whose diameter is enlarged at the connecting section. In an example of FIG. 14, it is supported from the flange for connection 505. It is connected to the flange for connection 505. This structure prevents inner pipe 501 being a straight pipe from moving during cooling down and warming-up period. As shown in FIG. 14, the space in which the intermediate radiation shield panel(s) 509 is provided is ensured by enlarging the diameter of outer pipe 506 at the connecting section. Furthermore, since the support is performed from the outer pipe 506 whose diameter is enlarged, a thermal resistance of support section 504 is large, so the heat leak by heat transmission is reduced. Lastly, the pipe is bent at such a connecting section.

When the bellows pipe section is bent, shapes of the intermediate radiation shield panel and outer pipe, etc. have to be changed. A flange is provided at the portion in which a bellows pipe is connected to a straight pipe, and however, they may be connected by welding without using the flange. In this situation, in supporting structure, a structure(s) which is fixed to each of inner pipe and outer pipe by welding is also needed.

Next, an introduction of a flow guide plate(s) in heat insulating double shell pipes will be described. In the present embodiment, a bellows pipe(s) (including a corrugate pipe(s)) is partially connected to a straight pipe. According to this, it can be bent. According to adopting this structure, the pressure loss is one digit smaller than that of pipes all made of bellows pipe(s) or corrugate pipe(s). However, since the surface of bellows pipe section, which is partially used, is greatly undulated, a large pressure loss will result if fluid such as liquid nitrogen is flowed. Because of this, the pressure loss of bellows pipe section has to be reduced as small as possible when a cable is constructed over the long distance. Therefore, in the present embodiment, a flow guide plate(s) is used at a bellows pipe section (including corrugate pipe section) which is partially used.

Figure 15:
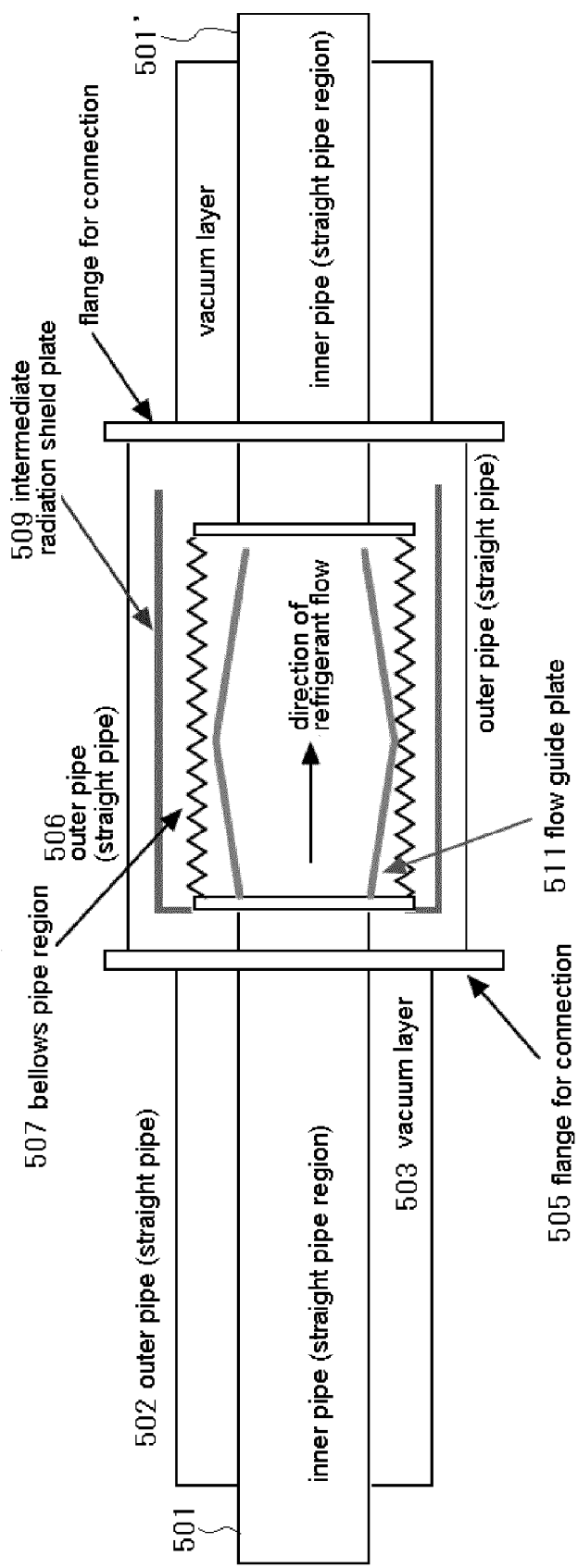
FIG. 15 shows one example of structure of a flow guide plate of an inner pipe bellows of one embodiment of the present invention.

FIG. 15 shows a structure in which a flow guide plate 511 is used at the bellows pipe section 507 (including corrugate pipe section). In inner pipe 501, the refrigerant flows in the direction of an arrow. Refrigerant includes three phases of solid, liquid and gas, and in many cases, it is multiphase flow which flows while in a mixed state. The inner pipe 501 is mainly constituted as a straight pipe. It can be bent because a bellows pipe or a corrugate pipe is used in the connecting section. The thermal contraction of the inner pipe is absorbed in the connecting section (bellows pipe). The flow guide plate 511 is located and secured along nearly inner pipe 501 in the upstream of the flow. The flow guide plate 511 is tubular in shape, and it is an example of a structure in which the pipe diameter is set to be enlarged in the middle thereof, followed by tapering so that the fluid is easy to flow into the inner pipe (straight pipe section) in the downstream.

The flow guide plate 511 has a structure in which it is not fixed or partially fixed to inner pipe 501' of the downstream. Particularly, since a thermal contraction occurs in this portion, it is necessary to have a certain extent of gap at room temperature. Therefore, since it is difficult to execute fixing support from both the inner pipe in the upstream 501 and the inner pipe in the down stream 501', a method of fixing in the upstream is generally employed.

The surface of the flow guide plate 511 is needed to be finished smooth. Gas is produced on the inner surface of bellows pipe 507 due to the heat invasion. Since it is necessary to cool this gas, materials having good thermal conductivity such as aluminum and/or copper are used for material of the flow guide plate 511. Since the bellows pipe section 507 is bent, the shape of the flow guide plate 511 has to be varied correspondingly.

Figure 16:
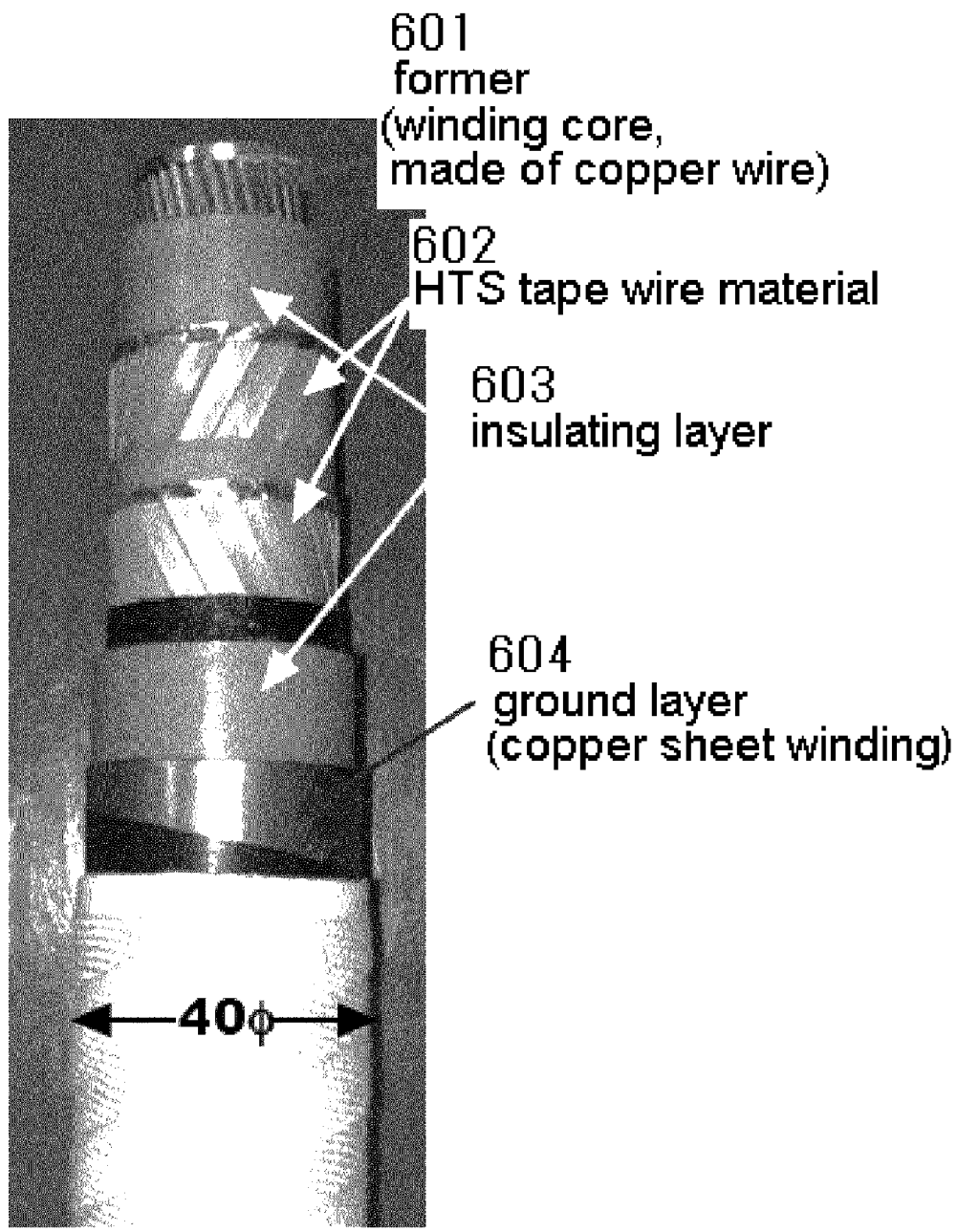
FIG. 16 shows one example of a High Temperature Superconductor (HTS) superconducting cable.

Next, an (electrically) insulating structure of HTS (high temperature superconducting) tape strands will be described. FIG. 16 shows a structure of a superconducting cable (high temperature superconducting cable). In this structure, a winding core (former) 601 is made by winding a copper wire, in the center of the cable so as to provide the cable with strength. There is an electric insulating layer above it, and furthermore tape wire material 102 made of high temperature superconductor (HTS) is disposed as a further upper layer. Eighteen HTS tapes are used in the inner layer, and twenty tapes are used in the outer layer. By using the same material as used for making insulating layer, one insulating layer is inserted between the inner layer and the outer layer. The object is that the tape can slide smoothly on the surface (of the insulation layer) when the cable is bent, and the insulating voltage is not so high. Carbon paper is wound on the HTS tape. There is an insulating layer 603 again, and a ground layer 604 is disposed above it for adjusting the potential. A cotton tape is wound as a covering material for protection. A nearly identical structure is also adopted in the design of an alternating current cable, and a larger amount of copper wire is used for a winding core located in the central portion for protection when short-circuit accident occurs.

In order to shield the alternating magnetic field produced by alternating current, it is a general design that HTS tape wire is insulated and wound around the former. With reference to FIG. 16, the HTS tape wire is in contact with the adjacent wire(s). Because of this, a current flows in an electrically perfect circular conductor. Alternating magnetic field caused by alternating current in the HTS tape wire having this structure induces eddy current in a silver sheath making up the HTS tape wire, and alternating current loss is increased. When the flowing current approaches a critical current, it is preferable that each of tape wire is insulated in order to reduce the alternating current loss. However, when all tape wires are insulated, if deterioration of a structure flowing current uniformly or tape wire material occurs, flowing current has to be set to be less. At this time, if a plurality of tape wires are in contact with each other, the current flows dividedly.

Figure 17:
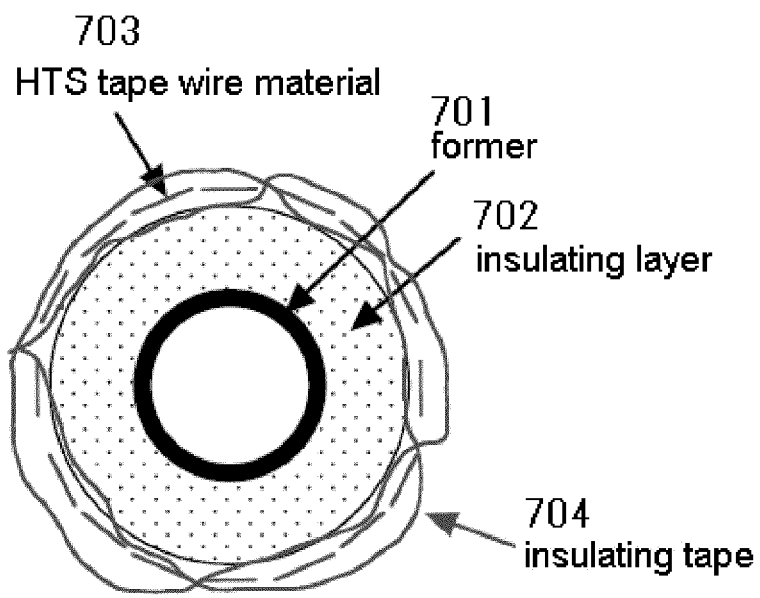
FIG. 17 shows a cross section of a superconducting cable of one embodiment of the present invention.

Hence, a structure as shown in FIG. 17 is adopted in the present embodiment. There is a winding core 701 in the center and an insulating layer 702 is disposed above it. HTS tape wire 403 is wound around the surface. At this time, an insulating tape 704 is inserted between a plurality of HTS tape wires 703 as shown in FIG. 17. Without limitation in particular, four tapes are made one group respectively, to form four groups as a whole. As it is a cable, it has to be bent. Tape wires 703 are twisted in a direction perpendicular to the paper, in accordance to which insulating tape(s) 704 is wound along them. According to this structure, divided current flow between a plurality of HTS tapes wires 703 is assured, and conductor which was (inherently) united is divided into each quarter in this case, eddy current loss becomes a quarter thereof. Therefore, alternating current loss can be reduced while keeping the stability.

Figure 18:
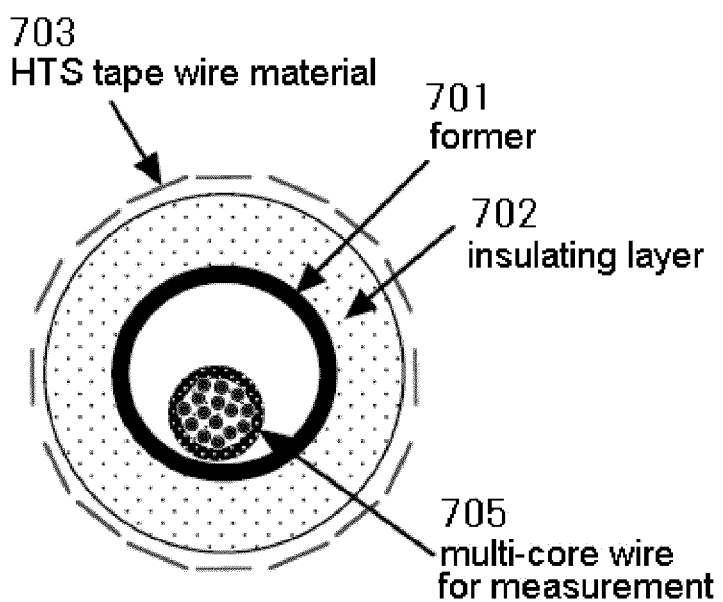
FIG. 18 shows a monitor wire(s) of a superconducting cable of one embodiment of the present invention.

Next, a method of monitoring the voltage of HTS tape wire 703 will be described. Superconducting characteristics of HTS tape wire 703 is different dependant on each tape wire (i.e. not completely same). In order to transmit power via superconductor over a long, it is necessary to monitor whether or not the tape wire is in a superconductive state (i.e. performance thereof). For example, the voltage of tape wire 703 is monitored. To this end, for example, taps have to be attached at both ends of the tape wire 703, and measurement wires have to be provided along the tape wire. In the present embodiment, as shown in FIG. 18, measurement wires (multi-core wire for measurement) 705 are located in a bore located inside of a winding core 701. Since the winding core is generally connected to the ground, it is tough (resistant) against exogenous (electric) noise, if measurement wires (multi-core wire for measurement) 705 are disposed in the winding core 701.

The entire disclosure of above mentioned Non-Patent Documents 1 to 3 are incorporated herein by reference thereto. The exemplary embodiments and examples may include variations and modifications without departing the gist and scope of the present invention as disclosed herein and claimed as appended herewith, and furthermore based on the fundamental technical spirit. It should be noted that any combination and/or selection of the disclosed elements may fall within the claims of the present invention. That is, it should be noted that the present invention of course includes various variations and modifications that could be made by those skilled in the art according to the overall disclosures including claims and technical spirit.

11 filament
12 pure silver
100 superconducting material powder
101 silver pipe for segmentation
102 silver pipe for outer coat
103 strand
201 guide
300 superconducting tape wire material
301 superconducting cable
302 former
303 cable attachment bracket section
304 spring
305 guide securing bracket
306 stopper
401 metal pipe
402 pipe-shaped flanged member
403, 404, 405 flange
406 bolt
501 inner pipe
502 outer pipe
503 vacuum layer
504 inner pipe supporting section
505 flange for connection
506 outer pipe (straight or Bellows pipe)
507 inner pipe bellows
508 inner pipe supporting section
509 intermediate radiation shield panel
510 attachment section of intermediate radiation shield panel
511 flow guide plate
601 former (winding core of SC cable)
602 HTS tape wire material
603 insulating layer
604 ground layer
701 winding core (former)
702 insulating layer
703 HTS tape wire material
704 insulating tape
705 multi-core wire for measurements

The invention claimed is:

1. A method of manufacturing a superconducting tape wire comprising:
    charging superconducting material powder in a first pipe having a flat elliptic or rectangular cross section;
    placing a plurality of said first pipes in a second pipe having a cross sectional shape in which a distance, along pressing direction, between opposing sides at an end portion(s) is larger than that at a central portion; and
    compressing said second pipe into a tape shape.

2. The method of manufacturing a superconducting tape wire according to claim 1,
    wherein prior to said charging, said first pipe having a flat elliptic or rectangular cross section is prepared in advance.

3. The method of manufacturing a superconducting tape wire according to claim 1,
    wherein a first pipe having a substantially circular cross section is prepared; and
    after superconducting material powder is charged in said first pipe, the first pipe is compressed to form the first pipe having a flat elliptic or rectangular cross section.

4. The method of manufacturing a superconducting tape wire according to claim 1,
    wherein said second pipe is rolled by using a rolling apparatus for a circular cross section or a square cross section and providing guides on the top and the bottom of said second pipe.

5. A method of manufacturing a superconducting cable,
    wherein upon securing a superconducting cable made of a superconducting tape wire manufactured by claim 1,
    thermal contraction/expansion of the superconducting cable is absorbed by an elastic member(s).

6. A method for securing a superconducting cable,
    wherein a pipe connected to said superconducting cable as defined in claim 5 is connected to a pipe-shaped flanged member,
    said pipe-shaped flanged member having a thread(s) on the inside of the pipe-shaped flanged member, and a groove(s) on the outside,
    and a flange functioning as a stopper is fitted into the groove(s) for restricting said pipe-shaped flanged member and the superconducting cable from rotation.

7. A superconducting tape wire,
    wherein superconducting material powder is charged in a first pipe having a flat elliptic or rectangular cross section;
    a plurality of said first pipes are placed in a second pipe having a cross sectional shape in which a distance, along a pressing direction, between opposing sides at an end portion(s) is larger than that at a central portion; and
    said second pipe is compressed to be finished in a tape shape.

8. An apparatus for securing a superconducting cable including said superconducting tape wire as defined in claim 7,
   wherein thermal contraction/expansion of said superconducting cable is absorbed in an elastic member(s) so that a thermal stress in a longitudinal direction of the superconducting cable is not large.

9. An apparatus for securing a superconducting cable comprising a pipe-shaped flanged member connected to a pipe connected to a superconducting cable including said superconducting tape wire as defined in claim 7, wherein a thread(s) is cut on the inside of the pipe-shaped flanged member, and a flange functioning as a stopper is fitted into said pipe-shaped flanged member.

10. A connecting device of a superconducting cable, comprising heat insulating double shell pipes having an inner pipe and an outer pipe in which a superconducting cable including said superconducting tape wire as defined in claim 7 is housed in the inner pipe, and inner pipes are connected via a bellows pipe section, and comprising a radiation shield panel covering said bellows pipe.

11. The connecting device of a superconducting cable according to claim 10,
   wherein said inner pipe and said outer pipe are secured so that said inner pipe does not move in the direction of thermal contraction.

12. The connecting device of a superconducting cable according to claim 10,
   wherein a flow guide plate is provided along a direction of refrigerant flow within said bellows pipe.

13. A superconducting cable including said superconducting tape wire as defined in claim 7, comprising a measuring wire(s) in the inside of the superconducting cable monitoring whether or not said superconducting tape wire is in a superconductive state.

* * * * *